(12) United States Patent
Huang et al.

(10) Patent No.: US 10,644,501 B2
(45) Date of Patent: May 5, 2020

(54) DRIVING CIRCUIT

(71) Applicant: Vanguard International Semiconductor Corporation, Hsinchu (TW)

(72) Inventors: Shao-Chang Huang, Hsinchu (TW); Shi-Hsiang Lu, Hsinchu (TW); Geeng-Lih Lin, Jhudong Township, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 425 days.

(21) Appl. No.: 15/210,196

(22) Filed: Jul. 14, 2016

(65) Prior Publication Data

US 2018/0019741 A1   Jan. 18, 2018

(51) Int. Cl.
*H02H 9/04* (2006.01)
*H03K 17/082* (2006.01)
*H01L 27/02* (2006.01)

(52) U.S. Cl.
CPC ......... *H02H 9/046* (2013.01); *H01L 27/0285* (2013.01); *H03K 17/0822* (2013.01)

(58) Field of Classification Search
CPC ........... H02H 9/04–046; H01L 27/0248–0296; H03K 17/0822
See application file for complete search history.

(56) References Cited

U.S. PATENT DOCUMENTS

| | | | |
|---|---|---|---|
| 9,172,244 B1 | 10/2015 | Ma | |
| 2008/0030910 A1* | 2/2008 | Fairgrieve | H03K 17/08142 361/56 |
| 2009/0091870 A1 | 4/2009 | Huang et al. | |
| 2012/0257308 A1 | 10/2012 | Li et al. | |
| 2013/0215539 A1* | 8/2013 | Chu | H02H 9/046 361/56 |
| 2013/0321962 A1 | 12/2013 | Lai et al. | |

(Continued)

FOREIGN PATENT DOCUMENTS

| | | |
|---|---|---|
| CN | 103683235 A | 3/2014 |
| CN | 103795049 A | 5/2014 |
| CN | 104704633 A | 6/2015 |

(Continued)

OTHER PUBLICATIONS

Chinese Office Action and Search Report for Chinese Application No. 201610156800.1, dated Jul. 27, 2018.

*Primary Examiner* — Thienvu V Tran
*Assistant Examiner* — Christopher J Clark
(74) *Attorney, Agent, or Firm* — Birch, Stewart, Kolasch & Birch, LLP

(57) ABSTRACT

A driving circuit controlling a voltage level of an input/output pad and having an electrostatic discharge (ESD) protection function comprises a detector, a controller, and a release control element. The detector is configured to couple to a power terminal and the input/output pad. The controller is coupled to the detector. The release control element is coupled to the power terminal or the input/output pad and coupled to the controller. When an ESD event occurs at the power terminal or the input/output pad, the detector activates the controller to a control signal to control the voltage level of the input/output pad.

4 Claims, 11 Drawing Sheets

(56) References Cited

U.S. PATENT DOCUMENTS

2015/0311700 A1* 10/2015 Lee .................. H02H 9/04
361/56

FOREIGN PATENT DOCUMENTS

| JP | 2013-207388 A | 10/2013 |
| TW | 201232756 A | 8/2012 |
| TW | 201327776 A1 | 7/2013 |
| WO | WO 2014/055959 A1 | 8/2012 |

* cited by examiner

DRIVING CIRCUIT

BACKGROUND OF THE INVENTION

Field of the Invention

The invention relates to a driving circuit, and more particularly to a driving circuit with an electrostatic discharge (ESD) protection function.

Description of the Related Art

Generally, every semiconductor integrated circuit comprises a plurality of input/output pads and controls at least one external element via the input/output pads. For example, the external element may be activated according to the voltage level of an input/output pad. However, when an electrostatic discharge (ESD) event occurs at the input/output pad, an ESD current may pass through the integrated circuit or the external element.

BRIEF SUMMARY OF THE INVENTION

In accordance with an embodiment, a driving circuit controlling a voltage level of an input/output pad and having an electrostatic discharge (ESD) protection function comprises a detector, a controller, and a release control element. The detector is configured to couple to a power terminal and the input/output pad. The controller is coupled to the detector. The release control element is coupled to the power terminal or the input/output pad and coupled to the controller. When an ESD event occurs at the power terminal or the input/output pad, the detector activates the controller so that the controller turns on the release control element to release ESD currents. When the ESD event does not occur at the power terminal and the input/output pad, the detector does not activate the controller and the release control element is turned on according to a control signal to control the voltage level of the input/output pad.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is the best-contemplated mode of carrying out the invention. This description is made for the purpose of illustrating the general principles of the invention and should not be taken in a limiting sense. The scope of the invention is best determined by reference to the appended claims.

Figure 1:
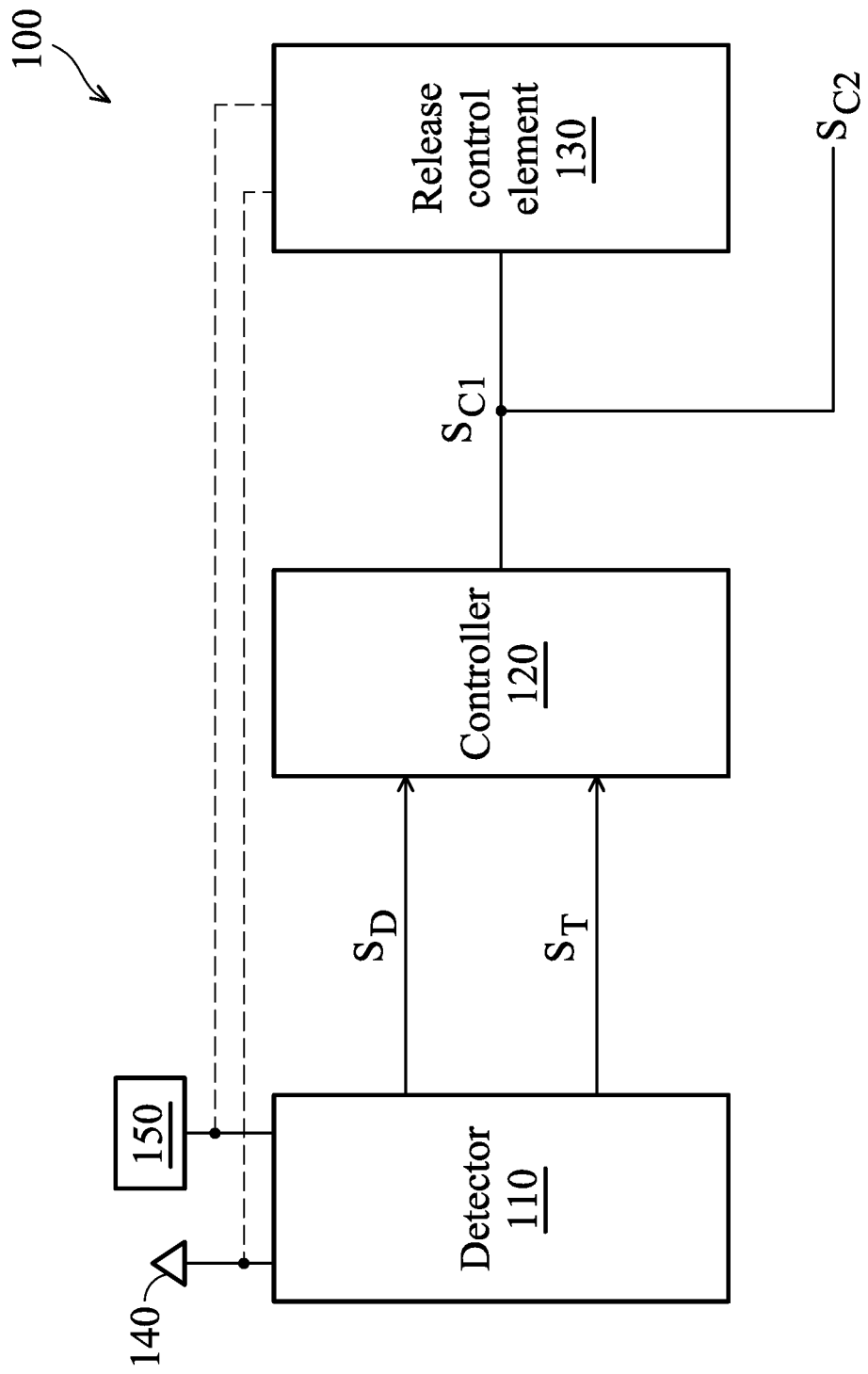
FIG. 1 is a block diagram of a driving circuit, according to various aspects of the present disclosure.

FIG. 1 is a block diagram of a driving circuit, according to various aspects of the present disclosure. The driving circuit 100 comprises a detector 110, a controller 120, and a release control element 130. In this embodiment, the driving circuit 100 is capable of controlling the voltage level of an input/output pad (I/O pad) 150 and has an ESD protection function to release an ESD current from the power terminal 140 or the input/output pad 150.

The detector 110 is coupled to the power terminal 140 and the input/output pad 150. The detector 110 detects whether an ESD event occurs at the power terminal 140 or the input/output pad 150 and generates a detection signal $S_D$ and a trigger signal $S_T$. Either the detection signal $S_D$ or the trigger signal $S_T$ is utilized to activate the controller 120. For example, when an ESD event occurs at the power terminal 140 or the input/output pad 150, the detector 110 utilizes the detection signal $S_D$ or the trigger signal $S_T$ to activate the controller 120. When no ESD event occurs at the power terminal 140 or the input/output pad 150, the detector 110 utilizes the detection signal $S_D$ or the trigger signal $S_T$ to de-activate the controller 120.

The controller 120 is coupled to the detector 110 and generates a control signal $S_{C1}$ according to the detection signal $S_D$ and the trigger signal $S_T$. In one embodiment, when the controller 120 is activated by the detection signal $S_D$, the controller 120 asserts the control signal $S_{C1}$ according to the trigger signal $S_T$. In this case, the controller 120 uses the trigger signal $S_T$ as the control signal $S_{C1}$. In another embodiment, when the controller 120 is activated by the trigger signal $S_T$, the controller 120 asserts the control signal $S_{C1}$ according to the detection signal $S_D$. In this case, the controller 120 uses the detection signal $S_D$ as the control signal $S_{C1}$.

The release control element 130 is coupled to the power terminal 140 or the input/output pad 150 and coupled to the controller 120. In one embodiment, when the control signal $S_{C1}$ is asserted, it means that an ESD event occurs at the power terminal 140 or at the input/output pad 150. Therefore, the controller 120 turns on the release control element 130 to release an ESD current from the power terminal 140 or from the input/output pad 150. However, when the control signal $S_{C1}$ is not asserted, it means that no ESD event occurs at the power terminal 140 or the input/output pad 150. At this time, the release control element 130 operates according to a control signal $S_{C2}$. For example, when the voltage level of the control signal $S_{C2}$ is at a pre-determined level, the release control element 130 is turned on to control the voltage level of the input/output pad 150. At this time, the release control element 130 serves as a buffer. When the voltage level of the control signal $S_{C2}$ is not at the pre-determined level, the release control element 130 is turned off.

Figure 2A:
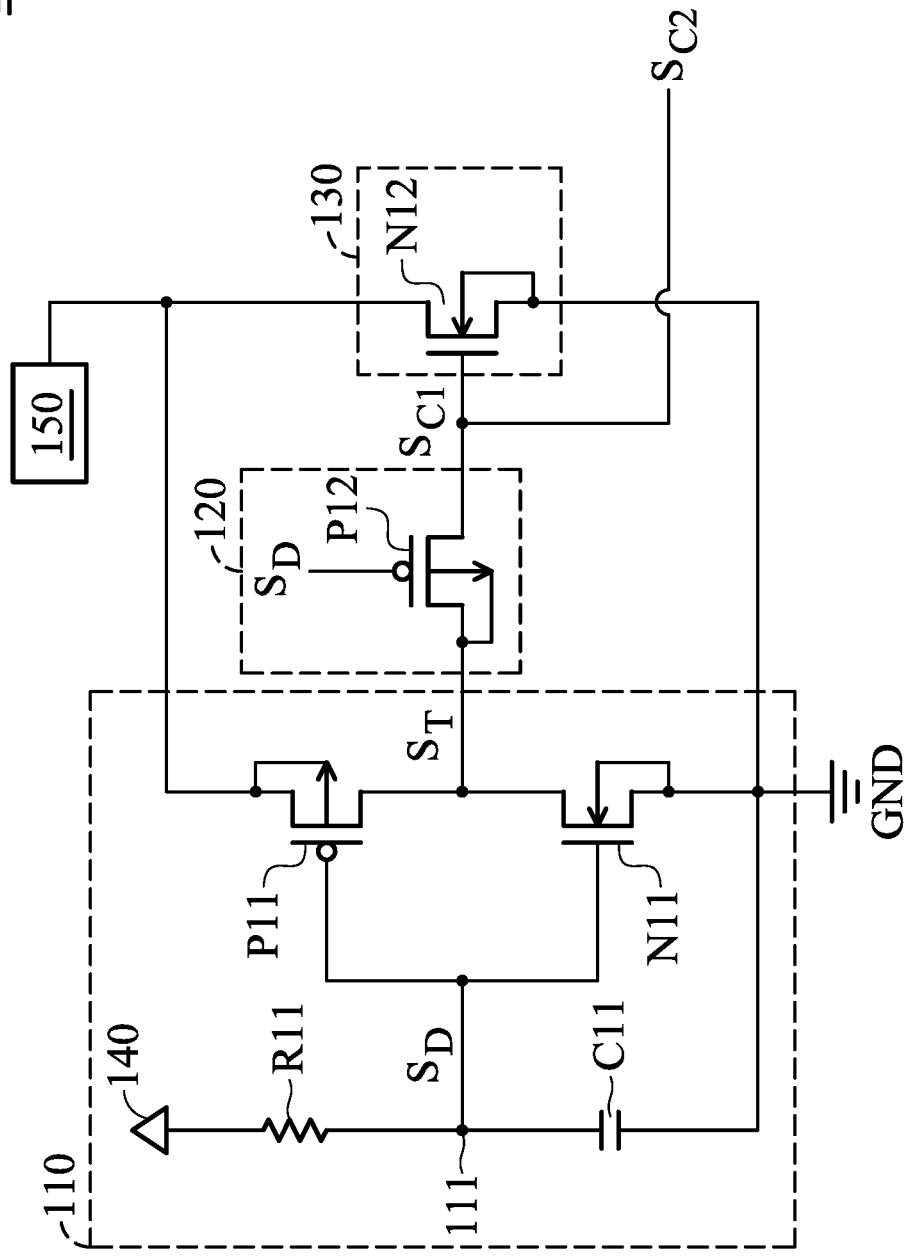
FIGS. 2A-2B are schematic diagrams of exemplary embodiments of the driving circuit, according to various aspects of the present disclosure.

FIG. 2A is a schematic diagram of an exemplary embodiment of the driving circuit, according to various aspects of the present disclosure. The detector 110 comprises a resistor R11, a capacitor C11, a P-type transistor P11, and an N-type transistor N11. The resistor R11 is coupled between the power terminal 140 and a node 111. The capacitor C11 is coupled between the node 111 and a ground terminal GND. In this embodiment, the resistor R11 and the capacitor C11 are configured to detect whether an ESD event occurs at the power terminal 140 or at the input/output pad 150 and to generate the detection signal $S_D$.

The gate of the P-type transistor P11 is coupled to the node 111. The source of the P-type transistor P11 is coupled to the input/output pad 150. The drain of the P-type transistor P11 is coupled to the controller 120. The gate of the N-type transistor N11 is coupled to the node 111. The source of the N-type transistor N11 is coupled to the ground terminal GND. The drain of the N-type transistor N11 is coupled to the drain of the P-type transistor P11. In this embodiment, the P-type transistor P11 and the N-type transistor N11 constitute an inverter and generate the trigger signal $S_T$ according to the detection signal $S_D$.

The controller 120 is a P-type transistor P12. The gate of the P-type transistor P12 is coupled to the node 111 to receive the detection signal $S_D$. The source of the P-type transistor P12 is coupled to the drain of the P-type transistor P11. The drain of the P-type transistor P12 is coupled to the release control element 130. The release control element 130 is an N-type transistor N12. The gate of the N-type transistor N12 is coupled to the drain of the P-type transistor P12. The source of the N-type transistor N12 is coupled to the ground terminal GND. The drain of the N-type transistor N12 is coupled to the input/output pad 150.

When a positive ESD event occurs at the input/output pad 150 and the power terminal 140 is coupled to ground, the driving circuit 200A operates in a protection mode. In the protection mode, the voltage level of the node 111 is at a low voltage level due the capacitive coupling of the capacitor C11. Since the voltage level of the detection signal $S_D$ is at the low voltage level, the P-type transistor P11 is turned on so that the voltage level of the trigger signal $S_T$ is at a high voltage level. At this time, since the P-type transistor P12 is also turned on, the voltage level of the control signal $S_{C1}$ is at the high voltage level. Therefore, the N-type transistor N12 is turned on. When the N-type transistor N12 is turned on, an ESD current is released from the input/output pad 150 to the ground terminal GND.

However, when no ESD event occurs at the input/output pad 150 or at the power terminal 140, the driving circuit 200A operates in a normal mode. In the normal mode, the power terminal 140 receives a high operation voltage (e.g. 3.3V), and the ground terminal GND receives a low operation voltage (e.g. 0V). Therefore, the voltage level of the node 111 is at the high voltage level. Since the voltage level of the detection signal $S_D$ is at the high voltage level, the N-type transistor N11 is turned on, and the P-type transistor P12 is turned off. At this time, the N-type transistor N12 operates according to the control signal $S_{C2}$. In one embodiment, when the control signal $S_{C2}$ is at a high voltage level, the N-type transistor N12 is turned on to set the voltage level of the input/output pad 150 at a low voltage level. In another embodiment, when the voltage level of the control signal $S_{C2}$ is at a low voltage level, the N-type transistor N12 is turned off to stop setting the voltage level of the input/output pad 150.

Figure 2B:
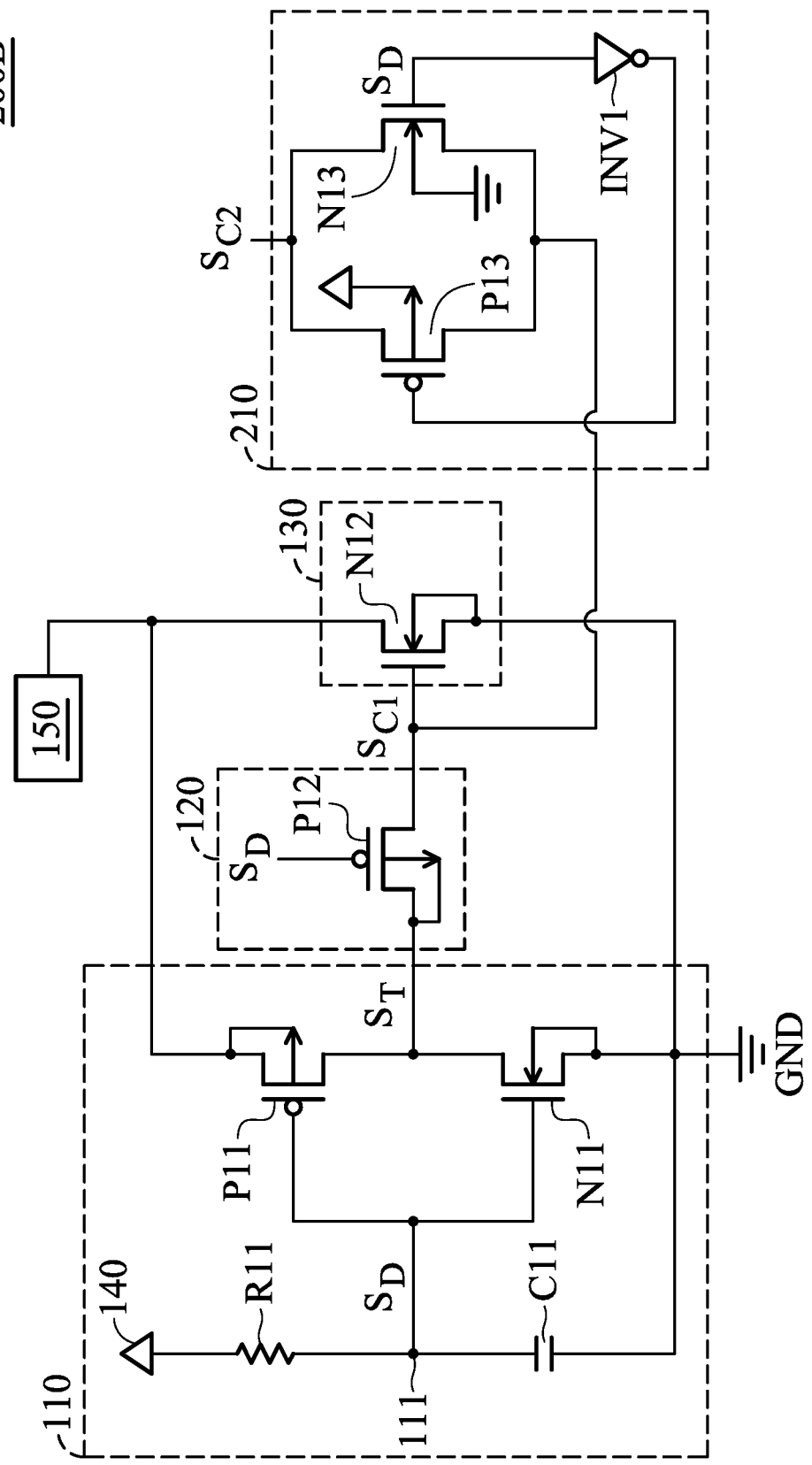

FIG. 2B is a schematic diagram of another exemplary embodiment of the driving circuit, according to various aspects of the present disclosure. FIG. 2B is similar to FIG. 2A except the addition of a transmission gate 210. Since the operations of the detector 110, the controller 120, and the release control element 130 shown in FIG. 2B are the same as the operations of the detector 110, the controller 120, and the release control element 130 shown in FIG. 2A, descriptions of the operations of the detector 110, the controller 120, and the release control element 130 shown in FIG. 2B are omitted for brevity.

In this embodiment, the transmission gate 210 transmits the control signal $S_{C2}$ to the N-type transistor N12 according to the voltage level (e.g. the detection signal $S_D$) of the node 111. In one embodiment, the control signal $S_{C2}$ is provided by an external element (not shown). The N-type transistor N12 controls the voltage level of the input/output pad 150 according to the control signal $S_{C2}$. As shown in FIG. 2B, the transmission gate 210 comprises a P-type transistor P13, an N-type transistor N13, and an inverter INV1.

The source of the P-type transistor P13 receives the control signal $S_{C2}$. The drain of the P-type transistor P13 is coupled to the gate of the N-type transistor N12. The gate of the N-type transistor N13 is coupled to the node 111 to receive the detection signal $S_D$. The source of the N-type transistor N13 is coupled to the drain of the P-type transistor P13. The drain of the N-type transistor N13 receives the control signal $S_{C2}$. The input terminal of the inverter INV1 is coupled to the gate of the N-type transistor N13. The output terminal of the inverter INV1 is coupled to the gate of the P-type transistor P13.

When the voltage level of the detection signal $S_D$ is at the low voltage level, it represents that a positive ESD event occurs with grounding GND. Therefore, the P-type transistor P13 and the N-type transistor N13 are turned off In this case, the transmission gate 210 resists an ESD current into other elements, such as the element which generates the control signal $S_C$. However, when the voltage level of the detection signal $S_D$ is at the high voltage level, it means that there has been no ESD event. Therefore, the P-type transistor P13 and the N-type transistor N13 are turned on to provide the control signal $S_{C2}$ to the gate of the N-type transistor N12. At this time, the N-type transistor N12 operates according to the control signal $S_{C2}$.

Figure 3A:
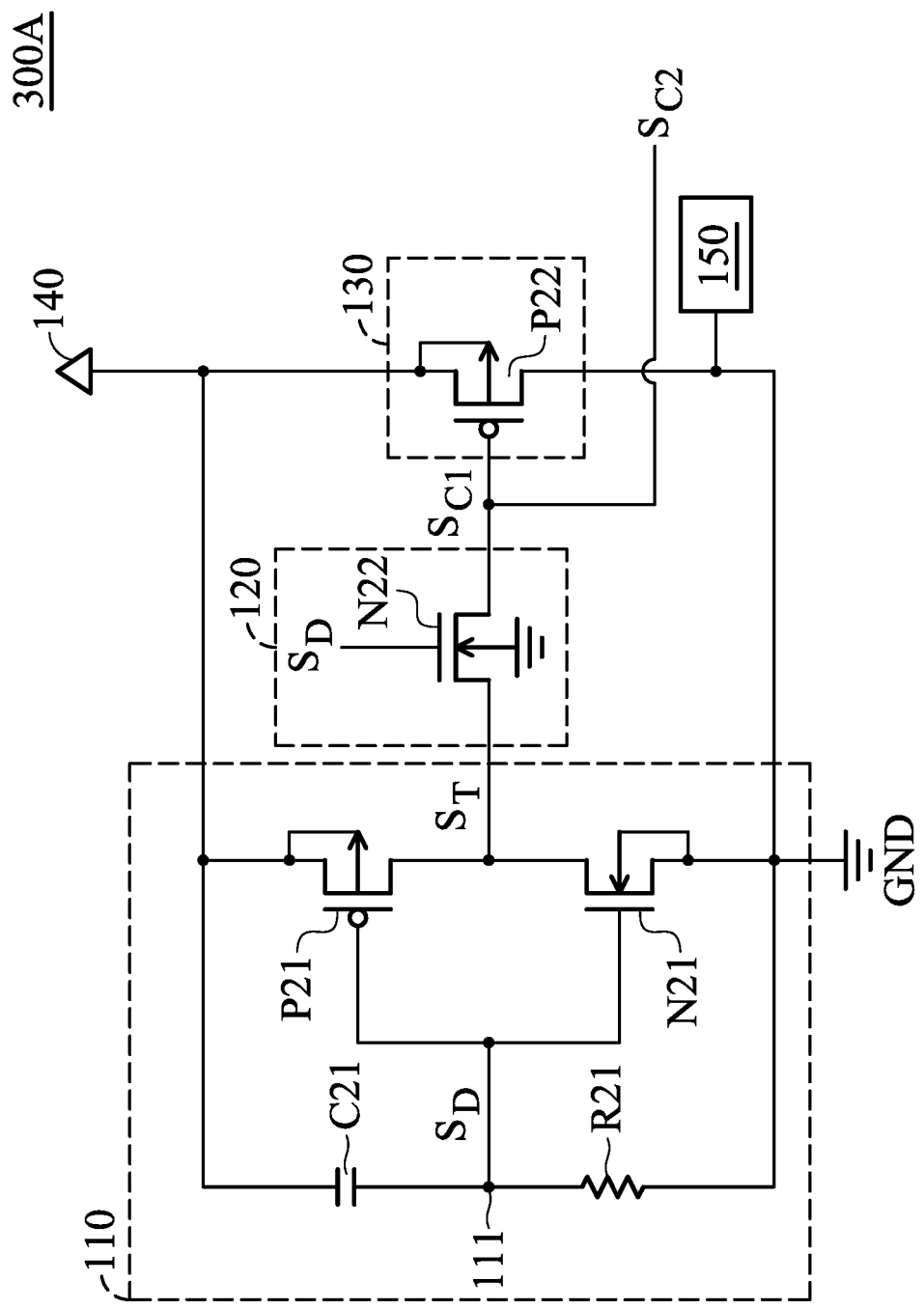
FIGS. 3A-3C are schematic diagrams of exemplary embodiments of the driving circuit, according to various aspects of the present disclosure.

FIG. 3A is a schematic diagram of another exemplary embodiment of the driving circuit, according to various aspects of the present disclosure. In this embodiment, the detector 110 comprises a capacitor C21, a resistor R21, a P-type transistor P21, and an N-type transistor N21. The capacitor C21 is coupled between the power terminal 140 and the node 111. The resistor R21 is coupled to the node 111 and the ground terminal GND. The capacitor C21 and the resistor R21 are configured to detect whether an ESD event occurs at the power terminal 140 and generate the detection signal $S_D$ at the node 111.

The gate of the P-type transistor P21 is coupled to the node 111. The source of the P-type transistor P21 is coupled to the power terminal 140. The drain of the P-type transistor P21 is coupled to the controller 120. The gate of the N-type transistor N21 is coupled to the node 111. The source of the N-type transistor N21 is coupled to the ground terminal GND. The drain of the N-type transistor N21 is coupled to the drain of the P-type transistor P21. In this embodiment, the P-type transistor P21 and the N-type transistor N21 constitute an inverter and generate the trigger signal $S_T$ according to the detection signal $S_D$.

The controller 120 is an N-type transistor N22. The gate of the N-type transistor N22 is coupled to the node 111 to receive the detection signal $S_D$. The source of the N-type transistor N22 is coupled to the release control element 130. The drain of the N-type transistor N22 is coupled to the drain of the P-type transistor P21 to receive the trigger signal $S_T$. The release control element 130 is a P-type transistor P22. The gate of the P-type transistor P22 is coupled to the source of the N-type transistor N22. The source of the P-type transistor P22 is coupled to the power terminal 140. The drain of the P-type transistor P22 is coupled to the input/output pad 150.

When a positive ESD event occurs at the power terminal 140 and the input/output pad 150 is coupled to ground, the driving circuit 300A enters a protection mode. In the protection mode, the voltage level of the detection signal $S_D$ is at the high voltage level. Therefore, the N-type transistors N21 and N22 are turned on so that the voltage level of the trigger signal $S_T$ and the control signal $S_{C1}$ are at the low voltage level. Therefore, the P-type transistor P22 is turned on to release an ESD current from the power terminal 140 to the input/output pad 150.

When no ESD event occurs at the power terminal 140 and the input/output pad 150 is grounded, and the power terminal 140 receives a high operation voltage, and the ground terminal GND receives a low operation voltage, the driving circuit 300A enters a normal mode. In the normal mode, the voltage level of the detection signal $S_D$ is at the low voltage level. Therefore, the P-type transistor P21 is turned on, and the N-type transistor N22 is turned off. Since the N-type transistor N22 is turned off, the P-type transistor P22 operates according to the control signal $S_{C2}$. In one embodiment, when voltage level of the control signal $S_{C2}$ is at a low voltage level, the P-type transistor P22 is turned on to set the voltage level of the input/output pad 150 at a high voltage level.

Figure 3B:
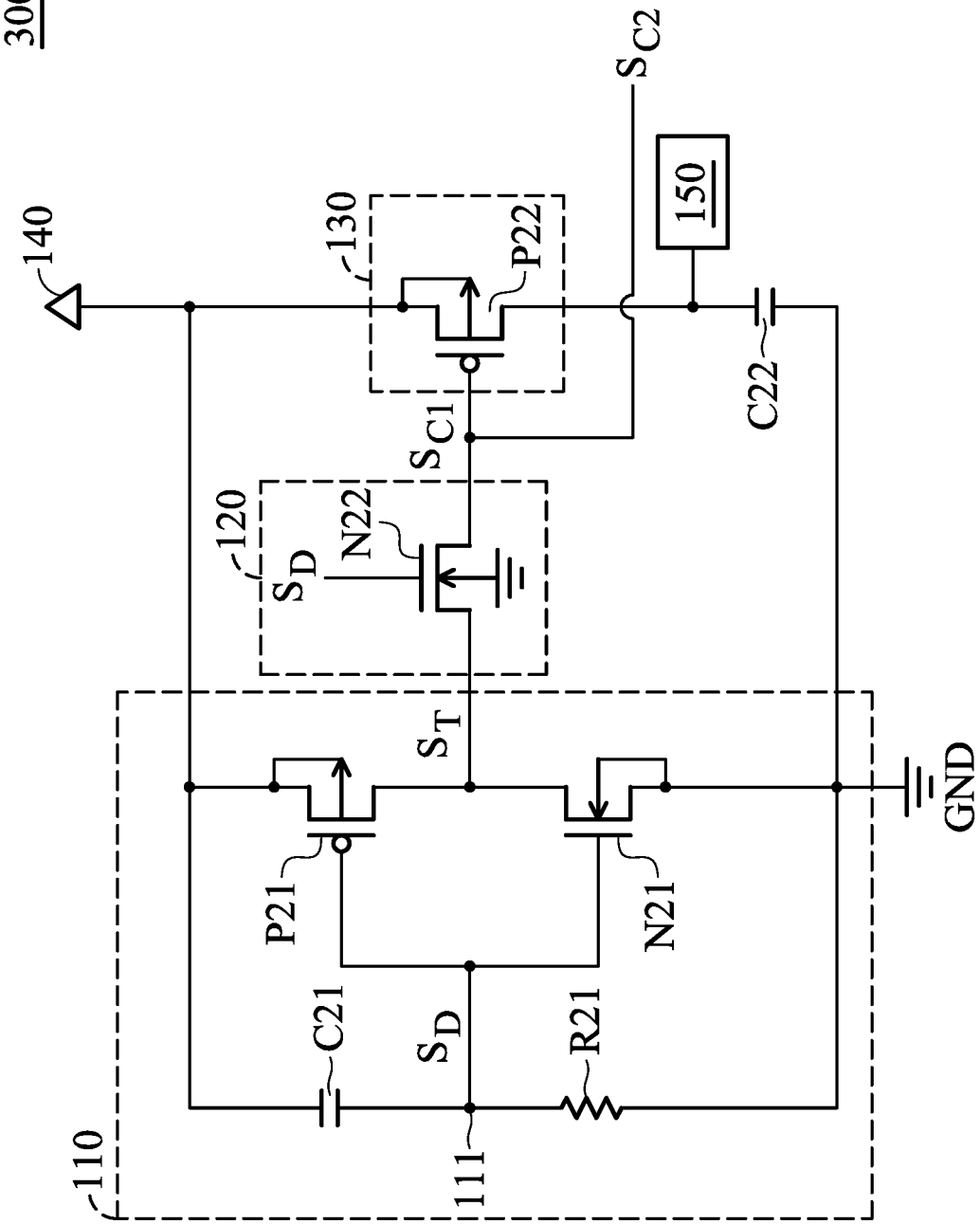

FIG. 3B is a schematic diagram of another exemplary embodiment of the driving circuit, according to various aspects of the present disclosure. FIG. 3B is similar to FIG. 3A except that the driving circuit 300B shown in FIG. 3B further comprises a capacitor C22. The capacitor C22 is coupled between the input/output pad 150 and the ground terminal GND to avoid the voltage level of the ground terminal GND at a floating level. In this case, when the driving circuit 300B operates in a protection mode, since the input/output pad 150 is grounded, the voltage level of the ground terminal GND is at a ground level due to the capacitive coupling of the capacitor C22. Since FIGS. 3A and 3B have the same principles, a description of FIG. 3B is omitted for brevity.

Figure 3C:
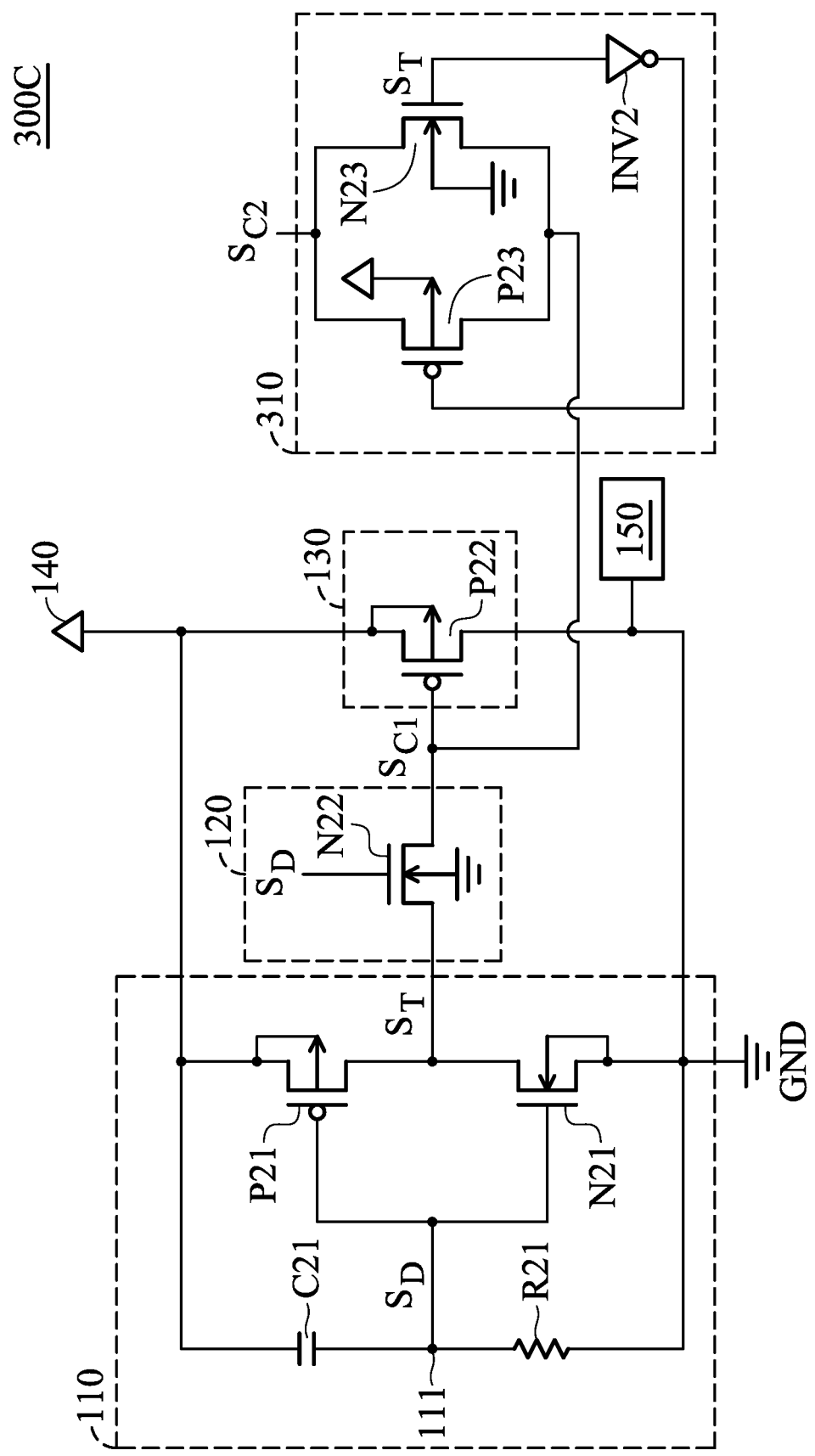

FIG. 3C is a schematic diagram of another exemplary embodiment of the driving circuit, according to various aspects of the present disclosure. FIG. 3C is similar to FIG. 3A with the exception that the driving circuit 300C shown in FIG. 3C further comprises a transmission gate 310. The transmission gate 310 transmits the control signal $S_{C2}$ to the P-type transistor P22 according to the voltage level (e.g. the trigger signal $S_T$) of the drain of the P-type transistor P21. Then, the P-type transistor P22 controls the voltage level of the input/output pad 150 according to the control signal $S_{C2}$.

In this embodiment, the transmission gate 310 comprises a P-type transistor P23, an N-type transistor N23, and an inverter INV2. The gate of the P-type transistor P23 is coupled to the output terminal of the inverter INV2. The source of the P-type transistor P23 receives the control signal $S_{C2}$. The drain of the P-type transistor P23 is coupled to the gate of the P-type transistor P22. The gate of the N-type transistor N23 is coupled to the drain of the P-type transistor P21 to receive the trigger signal $S_T$. The source of the N-type transistor N23 is coupled to the drain of the P-type transistor P23. The drain of the N-type transistor N23 receives the control signal $S_{C2}$. The input terminal of the inverter INV2 is coupled to the gate of the N-type transistor N23.

When the driving circuit 300C operates in a normal mode (no ESD event), the voltage level of the trigger signal $S_T$ is at a high voltage level. Therefore, the P-type transistor P23 and the N-type transistor N23 are turned on to provide the control signal $S_{C2}$ to the gate of the P-type transistor P22. When the voltage level of the control signal $S_{C2}$ is at a low voltage level, since the P-type transistor P22 is turned on, the voltage level of the input/output pad 150 is at the high voltage level. Since the operations of the detector 110, the controller 120, and the release control element 130 shown in FIG. 3C are the same as the operations of the detector 110, the controller 120, and the release control element 130 shown in FIG. 3A, descriptions of the detector 110, the controller 120, and the release control element 130 shown in FIG. 3C are omitted.

Figure 4A:
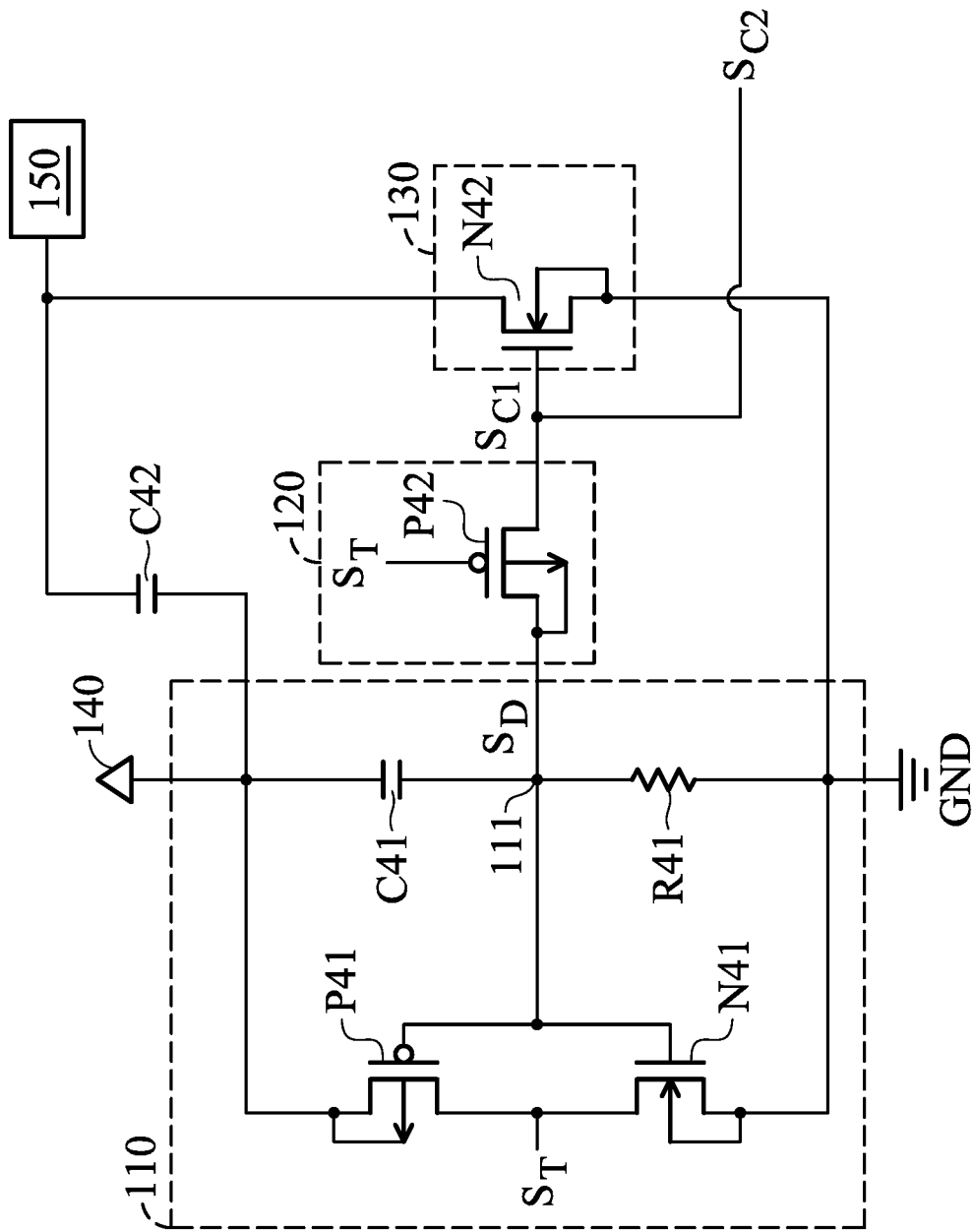
FIGS. 4A-4B are schematic diagrams of exemplary embodiments of the driving circuit, according to various aspects of the present disclosure.

FIG. 4A is a schematic diagram of another exemplary embodiment of the driving circuit, according to various aspects of the present disclosure. The detector 110 comprises a capacitor C41, a resistor R41, a P-type transistor P41, and an N-type transistor N41. The capacitor C41 is coupled between the power terminal 140 and the node 111. The resistor R41 is coupled between the node 111 and the ground terminal GND. The capacitor C41 and the resistor R41 are configured to detect whether an ESD event occurs at the power terminal 140 or at the input/output pad 150 and generate the detection signal $S_D$.

The gate of the P-type transistor P41 is coupled to the node 111. The source of the P-type transistor P41 is coupled to the input/output pad 150 through the capacitor C42. The gate of the N-type transistor N41 is coupled to the node 111. The source of the N-type transistor N41 is coupled to the ground terminal GND. The drain of the N-type transistor N41 is coupled to the drain of the P-type transistor P41 to output the trigger signal $S_T$.

In this embodiment, the controller 120 is a P-type transistor P42. The gate of the P-type transistor P42 is coupled to the drain of the P-type transistor P41 to receive the trigger signal $S_T$. The source of the P-type transistor P42 is coupled to the node 111 to receive the detection signal $S_D$. The drain of the P-type transistor P42 is coupled to the release control element 130. The release control element 130 is an N-type transistor N42. The gate of the N-type transistor N42 is coupled to the drain of the P-type transistor P42. The source of the N-type transistor N42 is coupled to the ground terminal GND. The drain of the N-type transistor N42 is coupled to the input/output pad 150.

The capacitor C42 is coupled between the power terminal 140 and the input/output pad 150. When a positive ESD event occurs at the input/output pad 150 and the ground terminal GND is grounded, the voltage level of the detection signal $S_D$ is at a high voltage level. At this time, the driving circuit 400A enters a protection mode. In the protection mode, since the voltage level of the detection signal $S_D$ is at the high voltage level, the N-type transistor N41 is turned on so that the voltage level of the trigger signal $S_T$ is at a low voltage level. In this case, the P-type transistor P42 is turned on. Since the voltage level of the detection signal $S_D$ is at the high voltage level, the voltage level of the control signal $S_{C1}$ is also at the high voltage level to turn on the N-type transistor N42. When the N-type transistor N42 is turned on, an ESD current is released from the input/output pad 150 to the ground terminal GND.

When no ESD event occurs at the power terminal 140 or the input/output pad 150, and the power terminal 140 receives a high operation voltage, and the ground terminal GND receives a low operation voltage, the driving circuit 400A enters a normal mode. In the normal mode, the voltage level of the detection signal $S_D$ is at a low voltage level. Therefore, the P-type transistor P41 is turned on. Since the source of the P-type transistor P41 is coupled to the power terminal 140, the voltage level of the trigger signal $S_T$ is at a high voltage level. Therefore, the P-type transistor P42 is turned off. In this case, the N-type transistor N42 is controlled by the control signal $S_C$. For example, when the voltage level of the control signal $S_{C2}$ is at a high voltage level, the N-type transistor N42 is turned on to set the voltage level of the input/output pad 150 at the low voltage level. When the voltage level of the control signal $S_{C2}$ is at a low voltage level, the N-type transistor N42 is turned off to stop setting the voltage level of the input/output pad 150 at the low voltage level.

Figure 4B:
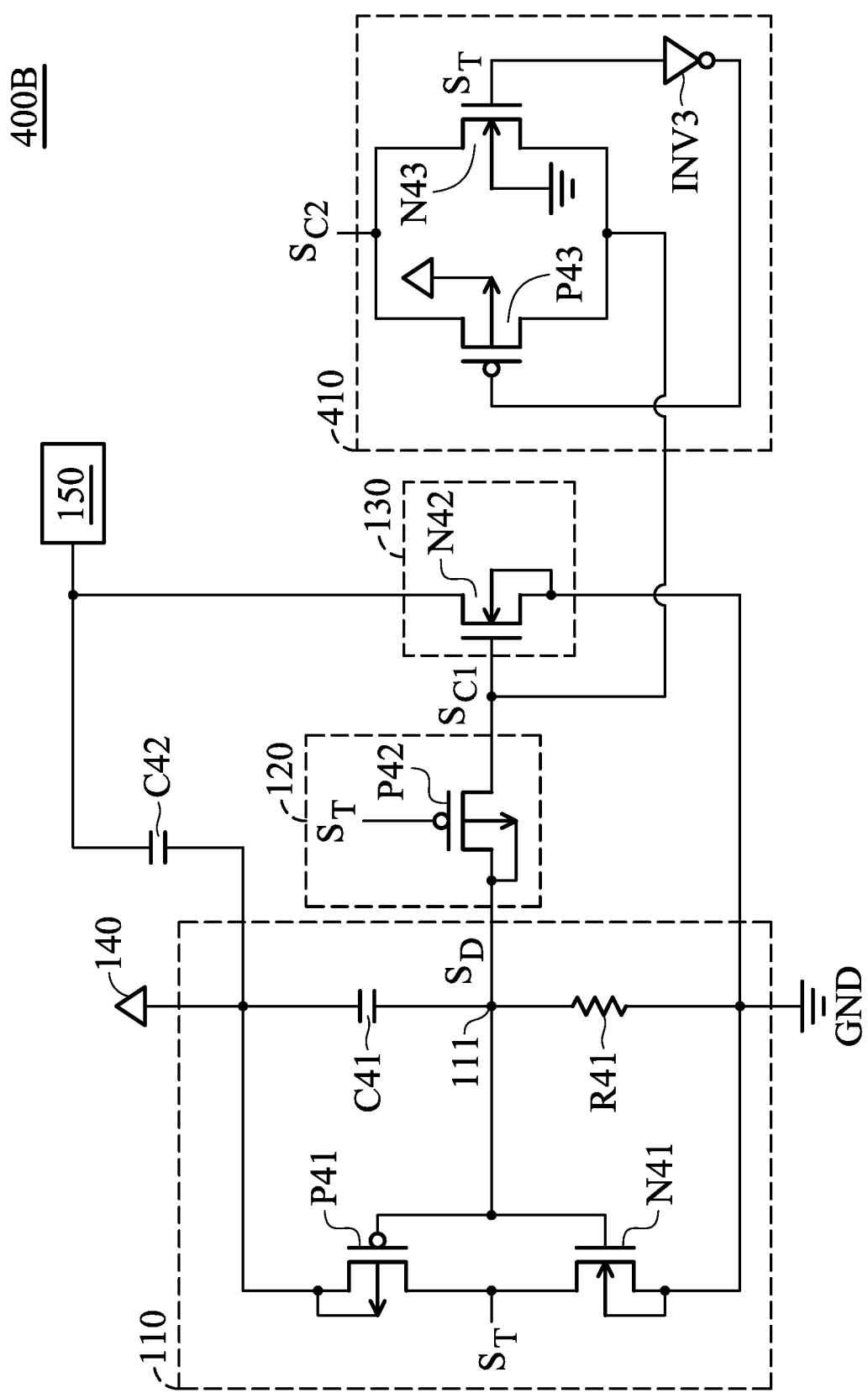

FIG. 4B is a schematic diagram of another exemplary embodiment of the driving circuit, according to various aspects of the present disclosure. FIG. 4B is similar to FIG. 4A except that the driving circuit 400B shown in FIG. 4B further comprises a transmission gate 410. The transmission gate 410 transmits the control signal $S_{C2}$ to the N-type transistor N42 according to the voltage level (i.e. the trigger signal $S_T$) of the drain of the P-type transistor P41.

As shown in FIG. 4B, the transmission gate 410 comprises a P-type transistor P43, an N-type transistor N43, and an inverter INV3. The gate of the P-type transistor P43 is coupled to the output terminal of the inverter INV3. The source of the P-type transistor P43 receives the control signal $S_{C2}$. The drain of the P-type transistor P43 is coupled to the gate of the N-type transistor N42.

The gate of the N-type transistor N43 is coupled to the drain of the P-type transistor P41 to receive the trigger signal $S_T$. The source of the N-type transistor N43 is coupled to the drain of the P-type transistor P43. The drain of the N-type transistor N43 receives the control signal $S_{C2}$. The input terminal of the inverter INV3 is coupled to the gate of the N-type transistor N43.

When the voltage level of the trigger signal $S_T$ is at a low voltage level, the N-type transistor N43 and the P-type transistor P43 are turned off. Therefore, the transmission gate 410 does not provide the control signal $S_{C2}$ to the N-type transistor N42. When the voltage level of the trigger signal $S_T$ is at a high voltage level, the N-type transistor N43 and the P-type transistor P43 are turned on to transmit the control signal $S_{C2}$ to the gate of the N-type transistor N42. At this time, if the voltage level of the control signal $S_{C2}$ is at a high voltage level, the N-type transistor N42 is turned on to set the voltage level of the input/output pad 150 at a low voltage level. If the voltage level of the control signal $S_{C2}$ is at a low voltage level, the N-type transistor N42 is turned off to stop setting the voltage level of the input/output pad 150.

Figure 5A:
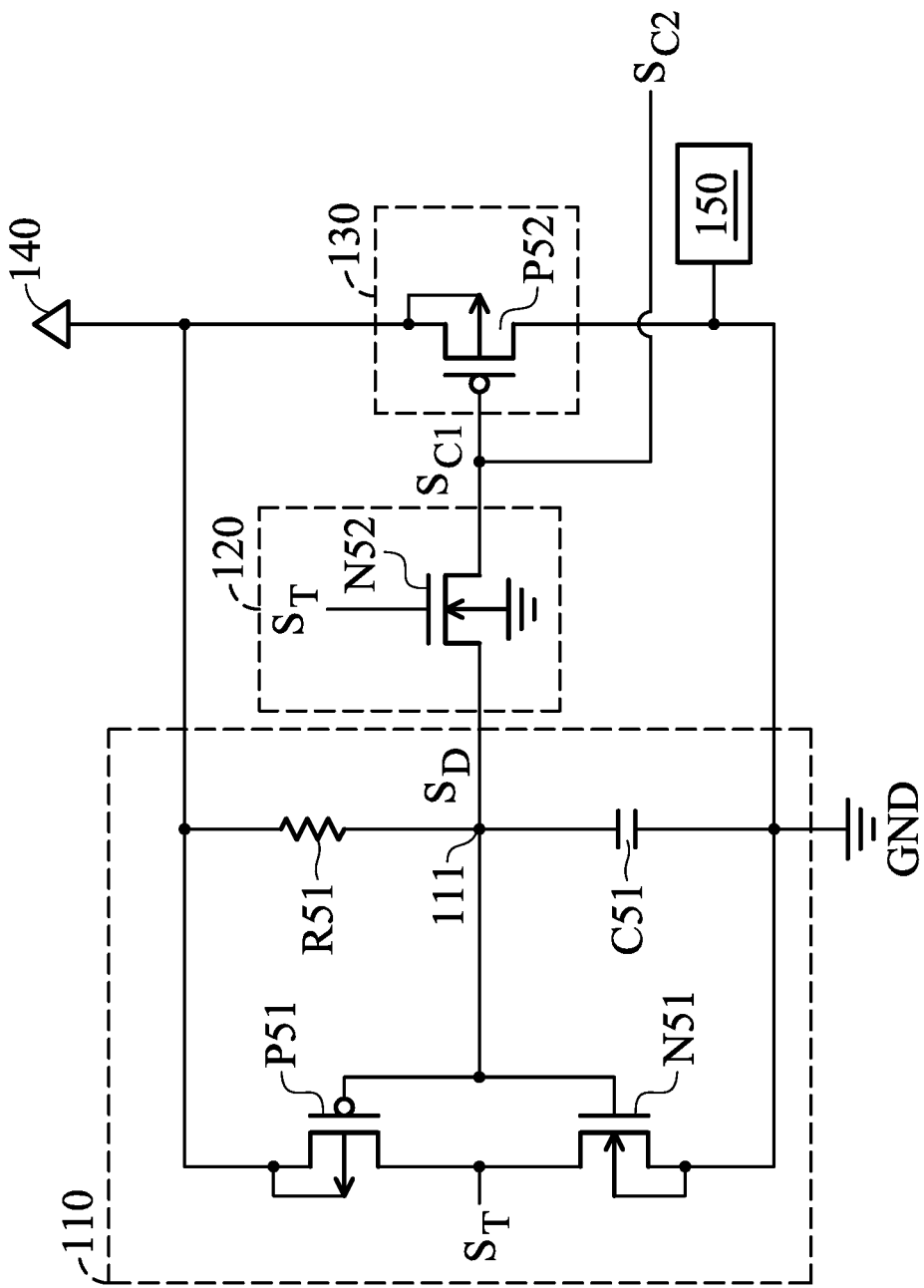
FIGS. 5A-5C are schematic diagrams of exemplary embodiments of the driving circuit, according to various aspects of the present disclosure.

FIG. 5A is a schematic diagram of another exemplary embodiment of the driving circuit, according to various aspects of the present disclosure. The detector 110 comprises a resistor R51, a capacitor C51, a P-type transistor P51, and an N-type transistor N51. The resistor R51 is coupled between the power terminal 140 and the node 111. The capacitor C51 is coupled between the node 111 and the ground node GND. The resistor R51 and the capacitor C51 are configured to determine whether an ESD event occurs at the power terminal 140 and generate the detection signal $S_D$. The gate of the P-type transistor P51 is coupled to the node 111. The source of the P-type transistor P51 is coupled to the power terminal 140. The gate of the N-type transistor N51 is coupled to the node 111. The source of the N-type transistor N51 is coupled to the ground terminal GND. The drain of the N-type transistor N51 is coupled to the drain of the P-type transistor P51.

In this embodiment, the controller 120 is an N-type transistor N52, and the release control element 130 is a P-type transistor P52. The gate of the N-type transistor N52 is coupled to the drain of the P-type transistor P51 to receive the trigger signal $S_T$. The source of the N-type transistor N52 is coupled to the node 111. The drain of the N-type transistor N52 is coupled to the release control element 130. The gate of the P-type transistor P52 is coupled to the drain of the N-type transistor N52. The source of the P-type transistor P52 is coupled to the power terminal 140. The drain of the P-type transistor P52 is coupled to the input/output pad 150.

When a positive ESD event occurs at the power terminal 140, and the input/output pad 150 is grounded, the driving circuit 500A enters a protection mode. In the protection mode, the voltage level of the detection signal $S_D$ is at a low voltage level. Therefore, the P-type transistor P51 is turned on so that the voltage level of the trigger signal $S_T$ is at a high voltage level. Since the voltage level of the trigger signal $S_T$ is at the high voltage level, the N-type transistor N52 is turned on so that the voltage level of the control signal $S_{C1}$ is at the low voltage level to turn on the P-type transistor P52. When the P-type transistor P52 is turned on, an ESD current is released from the power terminal 140 to the input/output pad 150.

When no ESD event occurs at the power terminal 140, and the power terminal 140 receives a high operation voltage, and the ground terminal GND receives a low operation voltage, which is lower than the high operation voltage, the driving circuit 500A enters a normal mode. In the normal mode, the voltage level of the detection signal $S_D$ is at the high voltage level so that the N-type transistor N51 is turned on. At this time, since the voltage level of the trigger signal $S_T$ is at a low voltage level, the N-type transistor N52 is turned off In this mode, the P-type transistor P52 controls the voltage level of the input/output pad 150 according to the control signal $S_{C2}$. For example, when the voltage level of the control signal $S_{C2}$ is at a low voltage level, the P-type transistor P52 is turned on to set the voltage level of the input/output pad 150 at a high voltage level. When the voltage level of the control signal $S_{C2}$ is at a high voltage level, the P-type transistor P52 is turned off to stop setting the voltage level of the input/output pad 150.

Figure 5B:
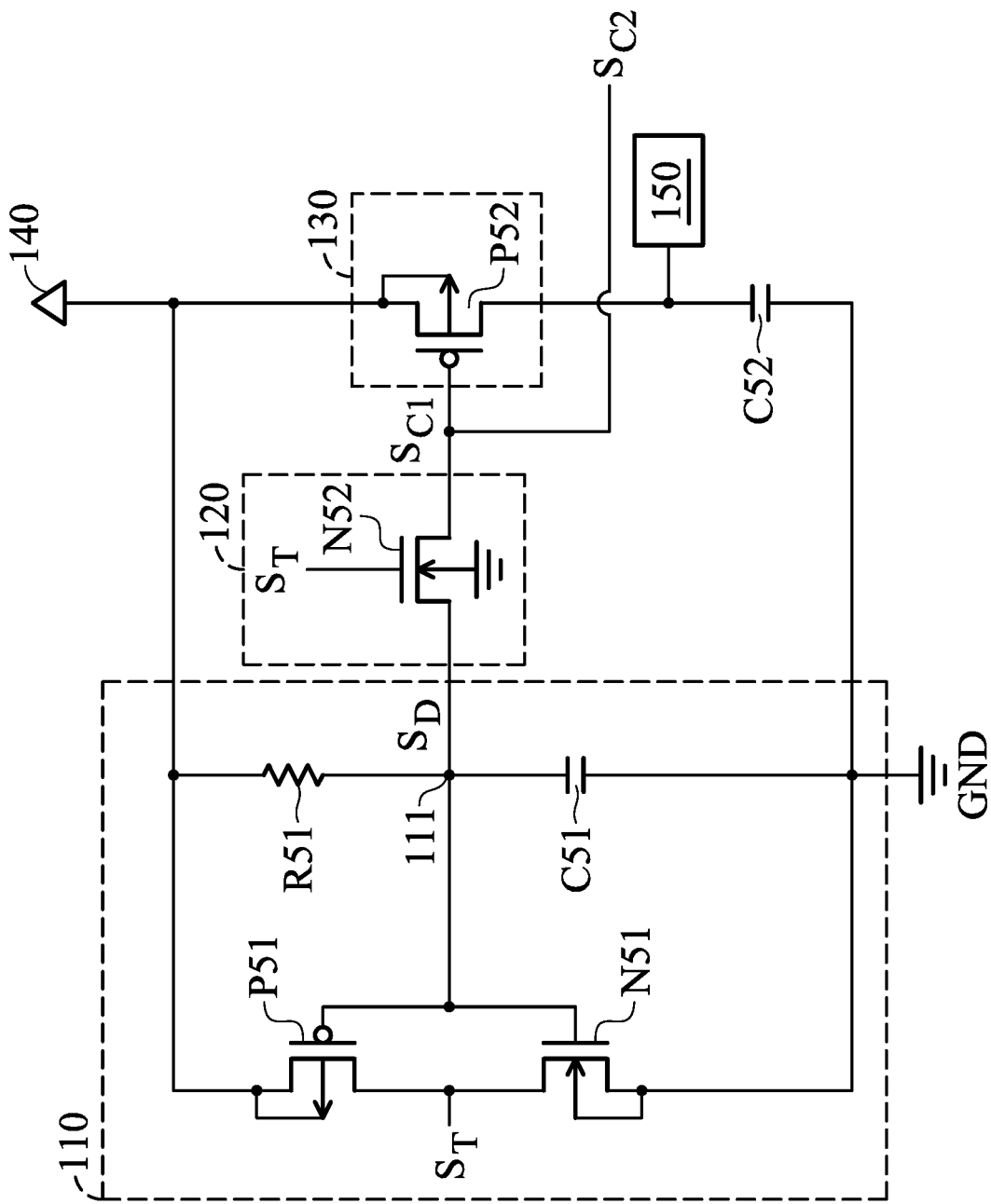

FIG. 5B is a schematic diagram of another exemplary embodiment of the driving circuit, according to various aspects of the present disclosure. FIG. 5B is similar to FIG. 5A except that the driving circuit 500B shown in FIG. 5B further comprises a capacitor C52. As shown in FIG. 5B, the capacitor C52 is coupled between the input/output pad 150 and the ground terminal GND to control the voltage level of the ground terminal GND. For example, when the input/output pad 150 is grounded, the voltage level of the ground terminal GND is also coupled to ground.

Figure 5C:
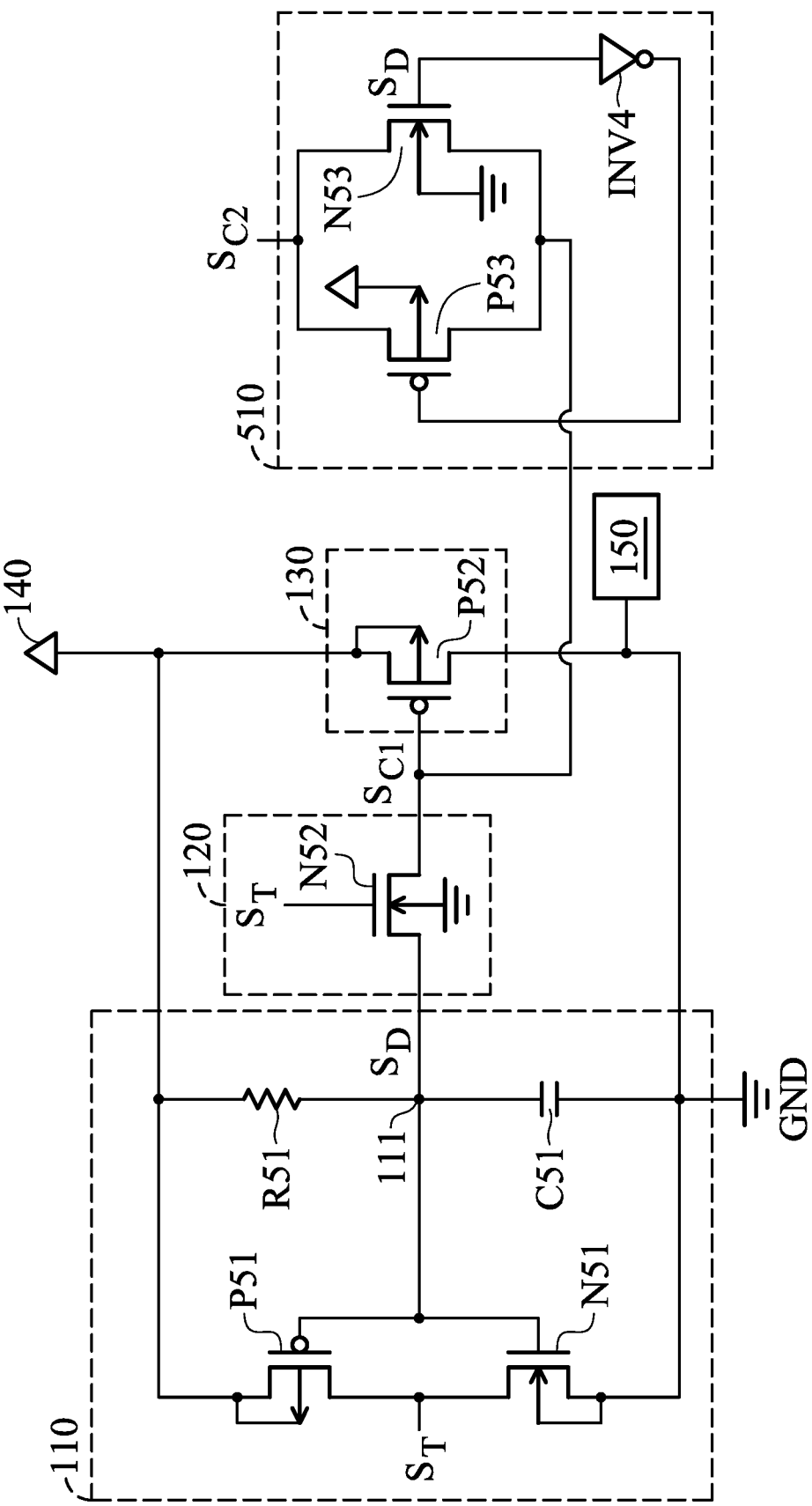

FIG. 5C is a schematic diagram of another exemplary embodiment of the driving circuit, according to various aspects of the present disclosure. FIG. 5C is similar to FIG. 5A except that the driving circuit 500C shown in FIG. 5C further comprises a transmission gate 510. The transmission gate 510 transmits the control signal $S_{C2}$ to the P-type transistor P52 according to the voltage level (i.e. the detection signal $S_D$) of the node 111. The P-type transistor P52 controls the voltage level of the input/output pad 150 according to the control signal $S_{C2}$.

In this embodiment, the transmission gate 510 comprises a P-type transistor P53, an N-type transistor N53, and an inverter INV4. The gate of the P-type transistor P53 is coupled to the output terminal of the inverter INV4. The source of the P-type transistor P53 receives the control signal $S_{C2}$. The drain of the P-type transistor P53 is coupled to the gate of the P-type transistor P52. The gate of the N-type transistor N53 is coupled to the node 111 to receive the detection signal $S_D$. The source of the N-type transistor N53 is coupled to the drain of the P-type transistor P53. The drain of the N-type transistor N53 receives the control signal $S_{C2}$. The input terminal of the inverter INV4 is coupled to the gate of the N-type transistor N53.

When the voltage level of the detection signal $S_D$ is at a low voltage level, the N-type transistor N53 and the P-type transistor P53 are turned off. Therefore, the transmission gate 510 does not provide the control signal $S_{C2}$ to the P-type transistor P52. When the voltage level of the detection signal $S_D$ is at a high voltage level, the N-type transistor N53 and the P-type transistor P53 are turned on to transmit the control signal $S_{C2}$ to the gate of the P-type transistor P52. At this time, if the voltage level of the control signal $S_{C2}$ is at the low voltage level, the P-type transistor P52 is turned on to set the voltage level of the input/output pad 150 at the high voltage level. If the voltage level of the control signal $S_{C2}$ is at the high voltage level, the P-type transistor P52 is turned off to stop setting the voltage level of the input/output pad 150.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit controlling a voltage level of an input/output pad and having an electrostatic discharge (ESD) protection function, comprising:
    a detector configured to couple to a power terminal and the input/output pad and comprising:
        a resistor;
        a capacitor connected to the resistor in series between the power terminal and a ground terminal to provide a detection signal; and
        an inverter directly connected to the input/output pad and comprising an input terminal and an output terminal, wherein the input terminal receives the detection signal and the output terminal provides a trigger signal;
    a controller coupled to the output terminal; and
    a release control element coupled to the input/output pad and coupled to the controller,
    wherein when an ESD event occurs at the input/output pad, the detector activates the controller so that the controller turns on the release control element to release an ESD current,
    wherein when the ESD event does not occur at the input/output pad, the power terminal receives a first operation voltage and the ground terminal receives a second operation voltage, the detector does not activate the controller and the release control element is turned on according to a control signal to control the voltage level of the input/output pad,
    wherein the inverter comprises:
        a first P-type transistor comprising a first gate coupled to a node, a first source coupled to the input/output pad, and a first drain coupled to the controller; and
        a first N-type transistor comprising a second gate coupled to the node, a second source coupled to the ground terminal, and a second drain coupled to the first drain of the first P-type transistor, and
    wherein the driving circuit further comprises a transmission gate transmitting the control signal to the release control element according to a voltage level of the node, wherein the release control element controls the voltage level of the input/output pad according to the control signal.

2. The driving circuit as claimed in claim 1, wherein the resistor is coupled between the power terminal and the node, and the capacitor is coupled between the node and the ground terminal.

3. The driving circuit as claimed in claim 2, wherein the controller is a second P-type transistor comprising a third gate coupled to the node, a third source coupled to the first drain, and a third drain coupled to the release control element,
    wherein the release control element is a second N-type transistor comprising a fourth gate coupled to the third drain, a fourth source coupled to the ground terminal, and a fourth drain coupled to the input/output pad.

4. The driving circuit as claimed in claim 1, wherein the transmission gate comprises:
    a third P-type transistor comprising a fifth source receiving the control signal, a fifth drain coupled to the fourth gate, and a fifth gate;
    a third N-type transistor comprising a sixth gate coupled to the node, a sixth source coupled to the fifth drain, and a sixth drain receiving the control signal; and
    an inverter comprising an input terminal coupled to the sixth gate and an output terminal coupled to the fifth gate.

* * * * *